United States Patent Office 3,533,796

Patented Oct. 13, 1970

3,533,796

LIGHT-SENSITIVE MATERIALS CONTAINING A PHOTO-CROSSLINKABLE COMPOSITION

Wolfgang Lässig, Cologne-Stammheim, Hans Ulrich and Erwin Müller, Leverkusen, and Karl Dinges, Cologne-Stammheim, Germany, assignors to Gevaert-Agfa N.V., Mortsel, Belgium, a Belgian company No Drawing. Filed Dec. 17, 1965, Ser. No. 514,688
Claims priority, application Germany, Dec. 24, 1964, A 47,992
Int. Cl. G03c *1/52, 1/68*
U.S. Cl. 96—91 4 Claims

ABSTRACT OF THE DISCLOSURE

Light-sensitive materials comprising a polymer containing N-methylol ester units or N-methylol ether units of acrylamide or methacrylamide in combination with a compound capable of giving off hydrogen ions under the influence of light are disclosed. Especially suitable photosensitive sources of hydrogen ion are diazoquinones of quinoline and their derivatives that are quaternized on the nitrogen atom. Such light-sensitive compositions are applied to a support, exposed to a pattern of light energy, and developed to produce a relief image on the support which corresponds to the pattern of light energy. This relief image is useful in preparing printed circuits, printing plates, and the like.

The present invention relates to light-sensitive layers for producing relief images, printed circuits or printing plates.

It is known to use various polymers as light-sensitive systems, which, when applied as a thin layer on a suitable support, are image-wise cross-linked i.e. hardened on exposure to light, so that in a subsequent developing step the non-cross-linked layer portions can be dissolved by means of a solvent or solvent system that is appropriate for the polymer used, the cross-linked portions being insoluble and thus remaining as a relief image on the support. Such like systems with layers having a sensitivity of their own, which act without additional photo-cross-linking agents such as dichromates or diazides and to which are added water-soluble polymers such as polyvinyl alcohol, natural products such as gelatin and albumins or hydrophobic substances such as cyclised rubber or copolymers of butadiene and styrene, have already been described. According to these systems can be used: the cinnamic acid ester of polyvinyl alcohol as well as cinnamic acid esters linked to polyvinyl alcohol chains by means of urethane groups as well as chalcones that are linked with polymers in the same way. Further it is known to prepare polymers containing azide groups having a sensitivity of their own in respect of light and U.V. radiation.

The known light-sensitive layers possess, however, certain disadvantages. In many cases the mechanical properties of the relief layers formed are not satisfactory for the intended uses. In other cases the layers possess an insufficient light-sensitivity.

It is an object of the present invention to provide light-sensitive layers, i.e. layers which under the influence of light can be locally cross-linked, that do not show the above disadvantages and are very well suitable for the preparation of relief images.

It has now been found that for this purpose are very well suitable, polymers containing in polymerised form N-methylolester units or N-methylolether units of acrylamide or methacrylamide, in combination with products that are able to split off hydrogen ions under the influence of light.

Preferred polymers of this type are those containing at least 20 mol percent of units corresponding to the following general formula:

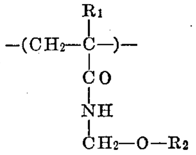

wherein:

$R_1$ represents a hydrogen atom or methyl group and $R_2$ represents an alkyl group comprising preferably at most 3 carbon atoms, or an acyl group, preferably acyl groups derived from aliphatic carboxylic acids having at most 3 carbon atoms.

The present invention is not only concerned with homopolymers comprising units of the above general formula but also with copolymers comprising in addition to the units of the above general formula monomer units of other polymerisable vinyl compounds such as acrylic and methacrylic acid, esters of these acids with aliphatic alcohols comprising preferably at most 5 carbon atoms, acrylamide, methacrylamide, acrylonitrile and methacrylonitrile.

The copolymers, however, should comprise at least 20% and preferably at least 40% of units containing N-methylol groups corresponding to the above general formula.

The polymers to be used according to the invention cross-link in the known way under the catalytic influence of hydrogen ions and by the simultaneous action of humidity and heat (ca. 1 min. 100° C.). The cross-linking is caused by the acid hydrolysis of the ether or ester groups to form methylol groups which immediately give rise to intermolecular condensation while most probably —NH—$CH_2$—NH— bridges are formed between the polymer chains.

The polymers which were previously water-soluble and film-forming are transformed by said cross-linking into an insoluble, hardened state.

When layers of the above-described polymers incorporate compounds which on exposure, particularly exposure to U.V.-radiation, split off hydrogen ions i.e. decompose under the formation of strong acids, the light-sensitive layer is image-wise cross-linked. Then, the unexposed layer portions may be washed away or transferred to another support by tearing them out. The preparation of relief images is generally performed in the following way. The light-sensitive layer is exposed through a transparent original to U.V-radiation and subsequently heated. As a consequent the above described cross-linking reaction takes place on the exposed areas resulting in an image-wise hardening of the polymer layer.

The exposed layer can be directly converted into a relief image by treating with water to remove the unhardened layer portions so that the exposed and thus cross-linked layer portions remain. According to another embodiment the unhardened layer portions are swollen by moistening the light-sensitive layer whereupon said layer is pressed against a second support for instance a sheet of paper so that, when peeling apart both materials, the unhardened layer portions are transferred to the second support. In the first case a negative relief image is formed whereas in the second case a positive image is obtained.

These relief images can be used directly for the formation of coloured copies either by dyeing said relief images after they have been formed or by incorporating dyes or pigments into the unprocessed light-sensitive layer. However, these relief images can also be used as masters for printing processes for instance for offset printing and screen printing.

All compounds that under the working conditions split off hydrogen ions by exposure to light and that are stable at storage temperature are suitable for being used as compounds initiating the cross-linking of the light-sensitive layer.

Especially suited have been proved diazoquinones of quinoline and their derivatives that are quaternised on the nitrogen atom. Compounds of the following general formula are preferred:

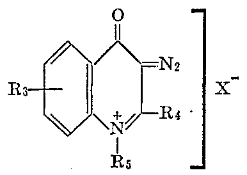

wherein:

$R_3$ represents an alkyl group, preferably a lower alkyl group of at most 3 carbon atoms, an aryl group, such as phenyl, a halogen atom, such as chlorine and bromine, an amino group, an alkyl-substituted amino group, a hydroxy group, an alkoxy group of at most 5 carbon atoms, a carbonamide group, or a hydrogen atom, $R_4$ represents a hydrogen atom or a lower alkyl group, preferably methyl, $R_5$ represents a lower alkyl group of preferably at most 4 carbon atoms, and $X^-$ represents any anion e.g. a bromide or a chloride ion, a sulphate ion or preferably an anion of aromatic sulphonic acids e.g. the anion of p-toluene sulphonic acid.

The preparation of these compounds is carried out by quaternization of the diazoquinones of quinoline, described in the literature, by means of an organic alkylating agent, such as e.g. alkyl halides, alkyl sulphate or alkyl esters of aromatic sulphonic acids.

The following is the preparation of compound I with both of $R_1$ and $R_2$ being hydrogen, $R_3$ being methyl and $X^-$ being $CH_3—C_6H_4—SO_3^{(-)}$.

17 g. of 3-diazoquinoline-4-one (O. Süss et al., Ann. 583 (1953) 150) are heated for 15 min. at 75° C. in 40 ccs. of benzene together with 40 g. of the methyl ester of p-toluene sulphonic acid whilst stirring. The compound dissolves and the quaternary salt separates. The mixture is stirred for another 30 min. whereupon the quaternary salt is sucked off and recrystallized from ethanol. Colourless needles are obtained with melting point: 173–174° C. (with decomposition). Yield: 15.6 g.

For the preparation of the light-sensitive layers according to the invention the polymers and the organic compounds splitting off hydrogen ions under the influence of light are dissolved in appropriate solvents such as water, lower alcohols (occasionally acetone) and the solutions obtained are applied to a support material by dipping, spreading or coating. Suitable support materials are e.g. paper sheets, such as Japan paper for screen printing, foils of metal or base materials coated with metals e.g. magnesium, aluminium, copper, zinc, iron, steel, titanium, tantalum, niobium, silver and gold, particularly noble metal for printed or etched circuits, plastic sheets such as polyamide sheets, polyester sheets, polycarbonate sheets or sheets of cellulose derivatives.

The exposure of light-sensitive layers prepared according to the present invention occurs by means of light sources common in the reproduction technique such as carbon arcs, xenon lamps, mercury vapour arcs and also sunlight, which sources in addition to visible light also irradiate an amount of U.V.-radiation which is particularly active for the photo-cross-linking. The development of the exposed layers generally occurs by means of water or solvents of a suitable composition, which solvents may be, but need not be similar to or the same as those used for dissolving the unexposed polymers.

EXAMPLE 1

To a baryta-coated paper support a layer is applied from a solution of 0.5 g. of compound I in 20 ccs. of a 5% aqueous solution of the methyl ether of poly-(N-methylol-methacrylamide) and 0.5 cc. of a 5% aqueous solution of diisobutyl-naphthalene-1-sodium-sulphonate. After having been dried a layer with a thickness of 12 microns is obtained. The material obtained is exposed for 4 min. through a transparent line- or screen negative by means of an 80 watt mercury vapour lamp placed at a distance of about 20 cm. On the areas struck by the light a slightly red coloured image is formed. Now the material is pressed for 1 min. with its light-sensitive layer against a metal plate heated to 110° C. (hot glaze press) whereupon the unhardened layer portions are washed away with running water. A slightly red-violet positive relief image of the original is obtained.

EXAMPLE 2

Example 1 is repeated with the difference, however, that 10 drops of black India ink are added to the coating solution. The gray-coloured layer is processed as described in Example 1 with the difference however, that the exposure time is increased to 8 minutes. The resulting positive relief image shows a well contrasting gray colour-tone.

EXAMPLE 3

Example 2 is repeated with the difference however, that the exposed and heated layer is not treated with water but pressed against a sheet of paper which has been moistened with water. When peeling apart the light-sensitive material from the sheet of paper a copy of the original is obtained on the latter.

In an analogous way light-sensitive layers can be prepared from polymers containing the following monomers in polymerised form:

(a) 50% of the methyl ether of N-methylol-methacrylamide
50% of methacrylamide
(b) 20% of the methyl ether of N-methylol-methacrylamide
80% of methacrylamide
(c) 50% of the methyl ether of N-methylol-methacrylamide
50% of acrylamide
(d) 50% of the acetic acid ester of N-methylol-methacrylamide
50% of methacrylamide
(e) 50% of the propionic acid ester of N-methylol-methacrylamide
50% of acrylamide

EXAMPLE 4

A nylon gauze having openings of 80$\mu$ is soaked with a solution of 0.5 g. of compound I in 25 ccs. of a 15% aqueous solution of the methyl ether of poly(N-methylol-methacrylamide) to which 5 ccs. of a 5% aqueous fuchsin solution and 1 cc. of a 2% saponine solution have been added.

After having been dried the gauze is exposed for 10 min. through a transparent line or screen original by means of a U.V.-lamp of 80 watts placed at a distance of 10 cm. Thereupon the gauze is heated to 80° C. by pressing it against a drying press for 1.5 min. The unhardened portions are washed away with running water. A screen printing stencil is obtained, which is positive in respect of the original and by means of which 5000 unobjectionable prints can be produced.

EXAMPLE 5

An aluminium foil, which has been superficially roughened by sand-blasting, is coated with a solution of 2 g. of compound I in 100 ccs. of a 4% aqueous solution of the methyl ether of poly(N-methylol-methacrylamide) and 1 cc. of a 5% aqueous solution of diisobutyl-naphthalene-1-sodiumsulphonate. After having been dried the material is further processed as described in Example 4. After having been treated with water an offset printing relief image is obtained which after having been rubbed in with a fixing solution as described, e.g., in British patent specification 969,072, takes up fatty printing inks. The printing plate obtained can be used to produce by means of an offset printing device 30,000 unobjectionable prints.

What we claim is:

1. A photosensitive element comprising a photosensitive layer containing in admixture a diazoquinone, which by exposure to light and in the presence of water forms acid yielding free hydrogen ions, and a water-soluble or water-swellable polymer containing at least 20 mole percent of recurring units corresponding to the following general formula:

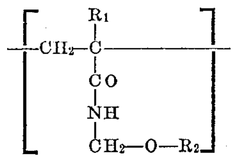

wherein:

$R_1$ represents hydrogen or methyl, and
$R_2$ represents a lower alkyl group or an acyl group.

2. A photosensitive element according to claim 1 wherein the diazoquinone compound is a diazoquinone of a quaternized quinoline.

3. A photosensitive element according to claim 1 wherein the said polymer contains recurring N-methylol methyl ether methacrylamide units.

4. A photosensitive element according to claim 2 wherein the diazoquinone of the quaternized quinoline corresponds to the following general formula:

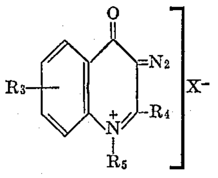

wherein:

$R_3$ represents a lower alkyl group, an aryl group, a halogen atom, an amino group, a hydroxy group, an alkoxy group, a carbonamide group or a hydrogen atom;
$R_4$ represents a hydrogen atom or a lower alkyl group;
$R_5$ represents a lower alkyl group; and
$X^-$ represents an anion.

References Cited

UNITED STATES PATENTS

| | | | |
|---|---|---|---|
| 1,587,272 | 6/1926 | Beebe et al. | 96—115 |
| 2,859,112 | 11/1958 | Sus et al. | 96—33 X |
| 2,978,432 | 4/1961 | Graulich et al. | 260—844 |
| 3,074,869 | 1/1963 | Workman | 96—115 X |
| 3,205,157 | 9/1965 | Licari et al. | 96—115 X |
| 3,268,333 | 8/1966 | Allman et al. | 96—115 X |

OTHER REFERENCES

Sykes, "A Guidebook to Mechanisms in Organic Chemistry," Longmans, 1963, p. 88.

GEORGE F. LESMES, Primary Examiner

R. E. MARTIN, Assistant Examiner

U.S. Cl. X.R.

96—28, 36.3, 115